United States Patent
Byun et al.

(10) Patent No.: US 7,598,762 B2
(45) Date of Patent: Oct. 6, 2009

(54) SEMICONDUCTOR DRIVER CIRCUIT WITH SIGNAL SWING BALANCE AND ENHANCED TESTING

(75) Inventors: Gyung-Su Byun, Seoul (KR); Kyu-Hyoun Kim, Suwon-si (KR); Woo-Seop Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 239 days.

(21) Appl. No.: 11/243,369

(22) Filed: Oct. 4, 2005

(65) Prior Publication Data

US 2006/0126403 A1    Jun. 15, 2006

(30) Foreign Application Priority Data

Dec. 14, 2004   (KR) ..................... 10-2004-0105326

(51) Int. Cl.
  *G01R 31/26* (2006.01)
  *G01R 31/02* (2006.01)
(52) U.S. Cl. .................... 324/765; 324/537; 324/158.1; 327/334
(58) Field of Classification Search ......... 324/754–765; 327/334
  See application file for complete search history.

(56) References Cited

U.S. PATENT DOCUMENTS

| 5,488,306 | A | 1/1996 | Bonaccio ................... 324/539 |
| 5,570,037 | A | 10/1996 | Llorens ...................... 326/30 |
| 5,838,177 | A | 11/1998 | Keeth ......................... 327/108 |
| 5,945,886 | A | 8/1999 | Millar ........................... 333/1 |
| 6,157,206 | A | 12/2000 | Taylor et al. ................. 326/30 |
| 6,711,073 | B2* | 3/2004 | Martin ....................... 365/198 |
| 6,774,656 | B2* | 8/2004 | Baur et al. .................. 324/765 |
| 2004/0207451 | A1* | 10/2004 | Kitagawa et al. ............ 327/334 |
| 2007/0195604 | A1* | 8/2007 | Kim ....................... 365/185.23 |

* cited by examiner

*Primary Examiner*—Ha Tran T Nguyen
*Assistant Examiner*—Emily Y Chan
(74) *Attorney, Agent, or Firm*—Monica H. Choi

(57) ABSTRACT

A semiconductor driver circuit includes impedance units for generating impedances at data pads, independently of each-other. Thus, signal swing widths of data signals generated at the data pads may be easily adjusted to be substantially equal for high operating speed. The semiconductor driver circuit also includes switching units for uncoupling at least one of the impedance units from at least one of the data pads for enhanced testing of the data pads.

17 Claims, 8 Drawing Sheets

US 7,598,762 B2

SEMICONDUCTOR DRIVER CIRCUIT WITH SIGNAL SWING BALANCE AND ENHANCED TESTING

BACKGROUND OF THE INVENTION

This application claims priority to Korean Patent Application No. 2004-105326, filed on Dec. 14, 2004, the disclosure of which is hereby incorporated herein by reference in its entirety.

1. Field of the Invention

The present invention relates generally to semiconductor devices, and more particularly to a driver circuit in a semiconductor device such as a semiconductor memory device, with signal swing balance and enhanced testing capability.

2. Description of the Related Art

Various semiconductor devices implemented as integrated circuit chips, such as a central processing unit (CPU), a memory device, or a gate array, are used within electronic products such as personal computers, servers, or workstations. As the operating speed of such electronic products becomes faster, a swing width of signals interfaced between the semiconductor devices decreases for minimizing signal delay time. However, as the swing width decreases, external noise interference increases and signal reflection due to impedance mismatching at an interface stage becomes critical.

Impedance mismatching may be caused by external noise, variation of power supply voltage, changes in operating temperature, and variations during manufacturing processes. Such impedance mismatching impedes high-speed data transmission and may distort output data. In turn, transmission of a distorted output signal frequently causes problems at a receiving side, such as setup/hold fail, erroneous input level determination, and the like.

In particular, in electronic products employing a dynamic random access memory (DRAM), the frequency of a signal bus has dramatically increased for high speed operation. Various bus termination techniques are being studied for minimizing the distortion of signal integrity by solving the impedance mismatching problem. One study revealed that, in an electronic system having a stub bus structure, on-die termination (ODT) rather than mother board termination (MBT) is more advantageous for signal integrity. One prior art reference relating to motherboard termination is U.S. Pat. No. 5,945,886, and one prior art reference relating to on-die termination is U.S. Pat. No. 6,157,206.

For on-die termination, bus termination is at an I/O port of a memory mounted on a memory module. Thus, on-die termination is also referred to as on-chip termination and is employed in the vicinity of pads in an integrated circuit chip.

In a semiconductor memory device such as a SDRAM (synchronous DRAM) of a double data rate (DDR) type, a resistor having a fixed resistance is coupled to a pad as typical on-die termination for impedance matching. However, such fixed resistance is disadvantageous for resistance termination when the environment of the signal receiver changes. Recently, on-die termination with changing resistance is being developed.

Data exchange modes in semiconductor devices employing on-die termination may be classified into a single-ended mode and a differential-ended mode. The single-ended mode semiconductor memory devices use a DC voltage as a reference voltage and determine the state of data based on a difference between the reference voltage and a data signal, thus requiring one data pad to transmit one-bit data. On the contrary, differential-ended mode semiconductor memory devices determine the state of data based on two complementary data signals, thus requiring two data pads to transmit one-bit data.

The differential-ended mode is robust to common mode noise for reduced signal swing width, thereby increasing operating frequency. Thus, the differential-ended mode is mainly used for an input and output circuit of high-speed semiconductor devices.

In general, an open test and a short and leakage test are performed on a semiconductor device. A main purpose of the open test is to determine whether a connection between a test system and a semiconductor device is normal. For a wafer, the state of a contact between each pad of a semiconductor device and a probe card is checked. For a package, the state of a contact between a pin of a semiconductor device and a socket is checked.

In the open test, input and output pads/pins of a semiconductor device are all grounded and a bias current is applied to a pad/pin to be tested. Thereafter, a voltage at the test pad/pin is measured to determine whether the measured voltage is within an acceptable range. If the measured voltage is within the acceptable range, the test pad/pin is determined as being in normal contact. If the reference range is not within the acceptable range, the test pad/pin is determined to be short-circuited or open-circuited.

The short and leakage test is for discovering a short fault between a pin and a pin, between a pin and a power supply voltage pin, or between a pin and a ground node. The short and leakage test may also be for measuring possible leakage current. In the short and leakage test, different voltage levels are applied to a test pin to be test and to adjacent pins, and then a current flowing through the test pin is measured. The measured current indicates any fault when compared to a suggested specification.

Testing of the single-ended mode semiconductor memory device is not as trouble-some as testing of the differential-ended mode semiconductor memory device. Differential-ended mode testing is disclosed in U.S. Pat. No. 5,488,306. In testing the differential-ended mode semiconductor memory device, termination resistance and an externally applied voltage may cause a problem, which will be described in greater detail with reference to FIG. 1.

FIG. 1 shows a conventional output driver circuit as an example of a differential-ended mode semiconductor device using on-die termination with variable resistance. As shown in FIG. 1, the conventional output driver circuit has a differential-ended mode structure, such as a differential amplifier. The output driver circuit comprises a first resistance unit 10, a second resistance unit 20, a clock input unit 30, and a biasing unit 40.

The first resistance unit 10 includes a plurality of resistors coupled in parallel between an external voltage terminal Vext and a first data pad DQ that outputs a first data signal. The first resistance unit 10 has a termination resistance that determines a voltage swing width of the first data signal. The second resistance unit 20 includes a plurality of resistors coupled in parallel between the external voltage terminal Vext and a second data pad DQB that outputs a second data signal. The second resistance unit 20 has a termination resistance that determines a voltage swing width of the second data signal. The first data signal is complementary to the second data signal.

The clock input unit 30 comprises a first NMOS transistor N10 connected between the first data pad DQ and the biasing unit 40 for receiving a first input clock signal IN at its gate, and a second NMOS transistor N12 connected between the second data pad DQB and the biasing unit 40 for receiving a second input clock signal INB at its gate. The second input clock signal INB is complementary to the first input clock signal IN.

The biasing unit 40 acts as a current source and determines the swing width of the first and second data signals. The biasing unit 40 includes NMOS transistors N14, N16, N18, N20 and N22 connected in parallel between the clock input unit 30 and a ground terminal. An external bias signal Bias applied at the gates of the NMOS transistors N14, N16, N18, N20 and N22 determines a current flowing through the biasing unit 40.

In the prior art of FIG. 1, the first resistance unit 10 and the second resistance unit 20 are controlled by one control signal Ctrl. Assuming that the first resistance unit 10 or the second resistance unit 20 each comprises three resistors, the control signal Ctrl has three binary control bits. The control signal Ctrl controls a number of resistors of the first resistance unit 10 and the second resistance unit 20 that becomes coupled to the respective data pads for such resistance units 10 and 20. The use of binary control bits allows fine control of the termination resistance.

The control signal Ctrl is commonly determined by a mode register set (MRS) code which is now briefly described. A mode register stores data programmed to control several operating modes of a synchronous semiconductor memory device. The asynchronous memory device has operating modes or features that are determined by a control signal. A central processing unit (CPU) sets operating modes to use, such as column address strobe (CAS) latency, a burst length and the like, of the synchronous semiconductor memory device in advance and then accesses the synchronous semiconductor memory device.

Such operating modes are set in the mode register, and a collection of a series of mode registers is called a mode register set (MRS). A series of codes indicating modes of the semiconductor memory device are set in the mode register set, and these codes are called mode register set codes.

Since the resistance of the first resistance unit 10 and the resistance of the second resistance unit 20 in the conventional output driver circuit are controlled by one control signal Ctrl, the resistances of the first and second resistance units 10 and 20 are the same in the prior art of FIG. 1.

FIG. 2 shows data signals output at data pads in FIG. 1 for a normal state, and FIG. 3 shows data signals in FIG. 1 having different voltage swing widths. In a normal state, the first data signal output at the first data pad DQ and the second data signal output at the second data pad DQB have the same voltage swing width S1, as shown in FIG. 2.

The logic state of data is determined based on whether a value obtained by subtracting a voltage level of the second data signal from a voltage level of the first data signal is positive or negative. For example, if the value obtained by subtracting the second data signal from the first data signal is positive, the logic state of data is "1" and, if the value is negative, the logic state is "0." If the first data signal and the second data signal have the same voltage swing width, the logic state of data is easily determined.

However, when the first data signal and the second data have different swing widths, the logic state of data may not be easily determined. For example in FIG. 3, a swing width S1 of the first data signal at the first data pad DQ is the same as the normal value in FIG. 2. However, a swing width S2 of the second data signal at the second data pad DQB is smaller than the normal value. With such variation in swing width, the logic state of data may not be easily determined.

The reduced swing width may be caused by variation in the resistance of the second resistance unit (20 of FIG. 1). Accordingly, control of the resistance of the second resistance unit 20 is desired. However, because the resistance of the first resistance unit 10 and the resistance of the second resistance unit 20 are controlled by one control signal, change in the control signal for controlling the resistance of the second resistance unit 20 also results in corresponding change in the resistance of the first resistance unit 10. Thus, achieving a same swing width in the first data signal and the second data signal is difficult.

In addition, detecting faults during an open test or a short and leakage test in the differential output driver circuit may be difficult because of a voltage level at the external voltage terminal Vext and because of the presence of the first and second resistance units 10 and 20. In other words, in the open test for the first data pad DQ or the second data pad DQB, detection of faults may be difficult because the voltage level at the external voltage terminal Vext is measured together through the first resistance unit 10 and the second resistance unit 20. In the short or leakage test on the first data pad DQ or the second data pad DQB, even though another voltage for testing is applied on adjacent pads, detection of faults may be difficult since current may flow from a voltage difference between the external voltage terminal Vext and the test voltage.

Thus, a driver circuit is desired with signal swing balance and with enhanced testing capability.

SUMMARY OF THE INVENTION

Accordingly, a semiconductor driver circuit of an aspect of the present invention includes first and second impedance units. The first impedance unit is for generating a first impedance at a first data pad in response to a first control signal. The second impedance unit is for generating a second impedance at a second data pad in response to a second control signal independent of the first control signal.

In an embodiment of the present invention, the first data pad outputs a first data signal, and the second data pad outputs a second data signal that is complementary to the first data signal.

In another embodiment of the present invention, the first impedance unit includes first transistors, each coupled in series with a respective first resistor. In that case, the first control signal determines which of the first transistors is turned on and which of the first respective resistors is coupled to the first data pad. Similarly, the second impedance unit includes second transistors, each coupled in series with a respective second resistor. The second control signal determines which of the second transistors is turned on and which of the second respective resistors is coupled to the second data pad.

In a further embodiment of the present invention, the first and second control signals are adjusted until the voltage swings of the first and second data signals are substantially equal.

In yet another embodiment of the present invention, the semiconductor driver circuit includes first and second switching units. The first switching unit is coupled between the first impedance unit and the first data pad, and the second switching unit coupled between the second impedance unit and the second data pad. At least one of the first and second switching unit uncouples at least one of the first and second impedance units from at least one of the first and second data pads during testing.

For example, for performing an open testing on the semiconductor device, one of the data pads is selected for the open testing. Each of the data pads are uncoupled from the respective impedance unit, and any unselected data pad and an external voltage pad are grounded. A predetermined current level is applied to the selected data pad, and a resulting voltage is measured at the selected data pad. Whether the measured resulting voltage is within an acceptable range is determined.

On the other hand, for performing leakage/short testing on the semiconductor device, one of the data pads is selected for the leakage/short testing. The selected data pad is uncoupled from the respective impedance unit, and any unselected data pad is coupled to the respective impedance unit. A first voltage is applied to an external voltage pad and each of the unselected data pads, and a second voltage is applied to the selected data pad. A resulting current flowing through the selected data pad is measured. Whether the measured resulting current is within an acceptable range is determined.

In one embodiment of the present invention, the first voltage level is a supply voltage level, and the second voltage level is ground. In another embodiment of the present invention, the second voltage level is a supply voltage level, and the first voltage level is ground.

In this manner, with independent control of the resistance in the first and second impedance units, signal swing widths at the first and second data pads may be adjusted to be substantially same for high speed operating frequency. In addition, by including switches to the first and second impedance units, the semiconductor driver circuit has enhanced testing capability.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and/or function.

DETAILED DESCRIPTION OF THE INVENTION

Figure 1:
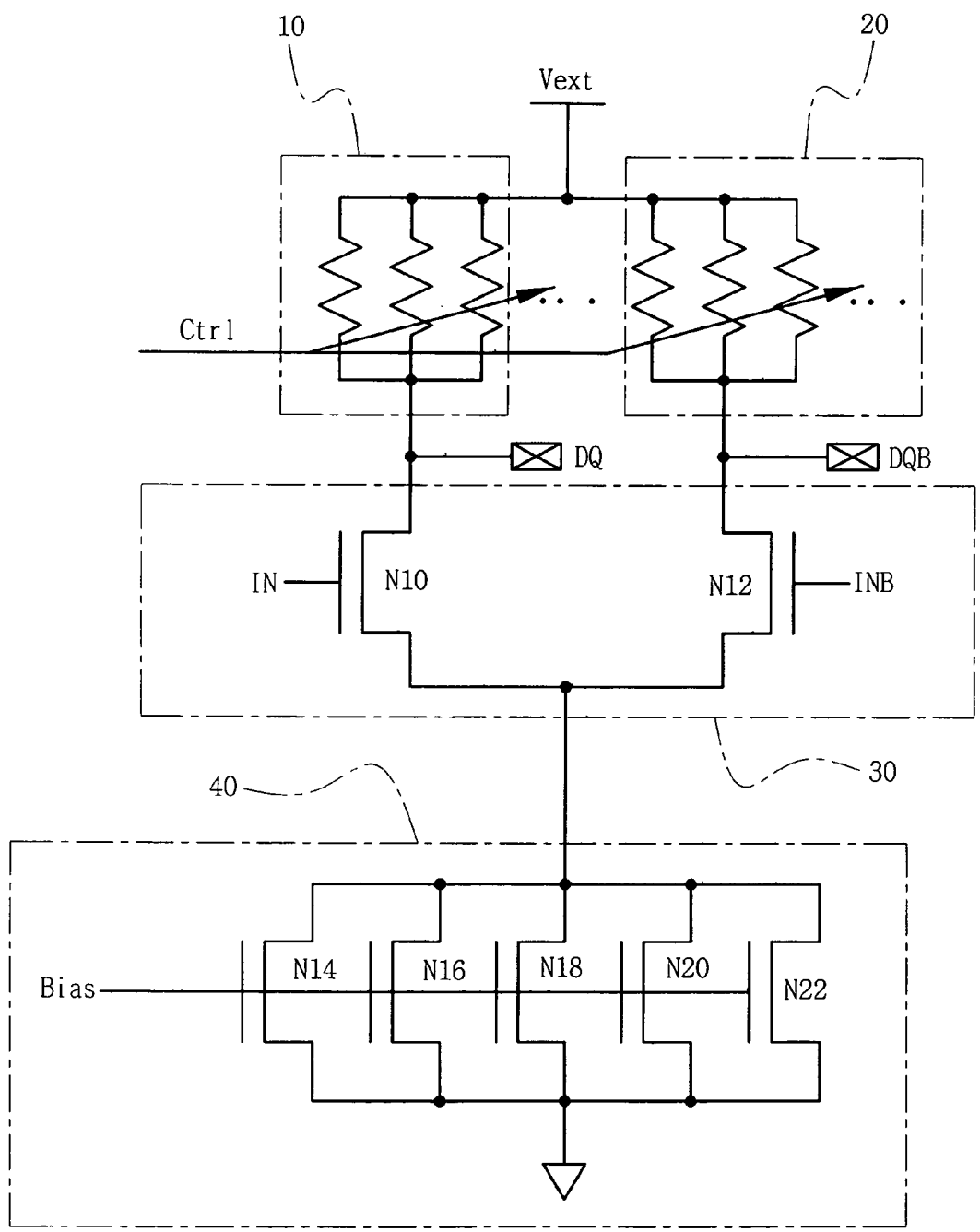
FIG. 1 is a circuit diagram of a conventional semiconductor driver circuit.
Figure 2:
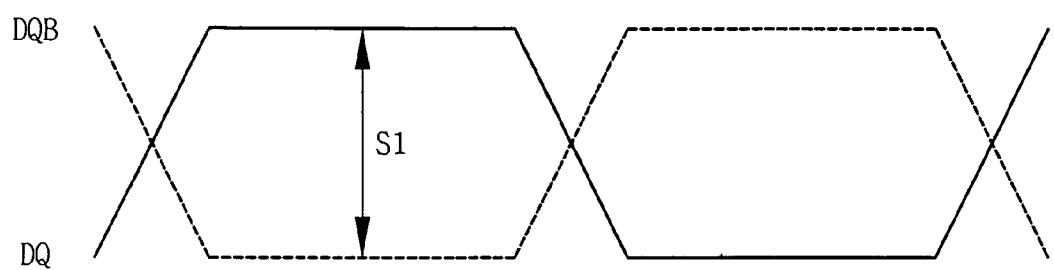
FIG. 2 is a diagram of data signals in FIG. 1 with a normal state.
Figure 3:
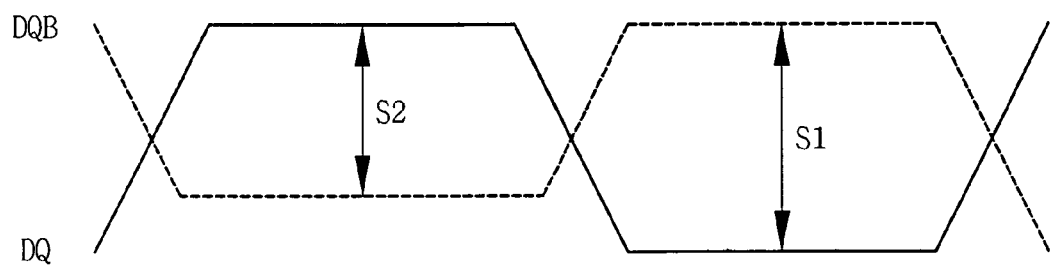
FIG. 3 is a diagram of data signals in FIG. 1 with undesired signal swing width.
Figure 4:
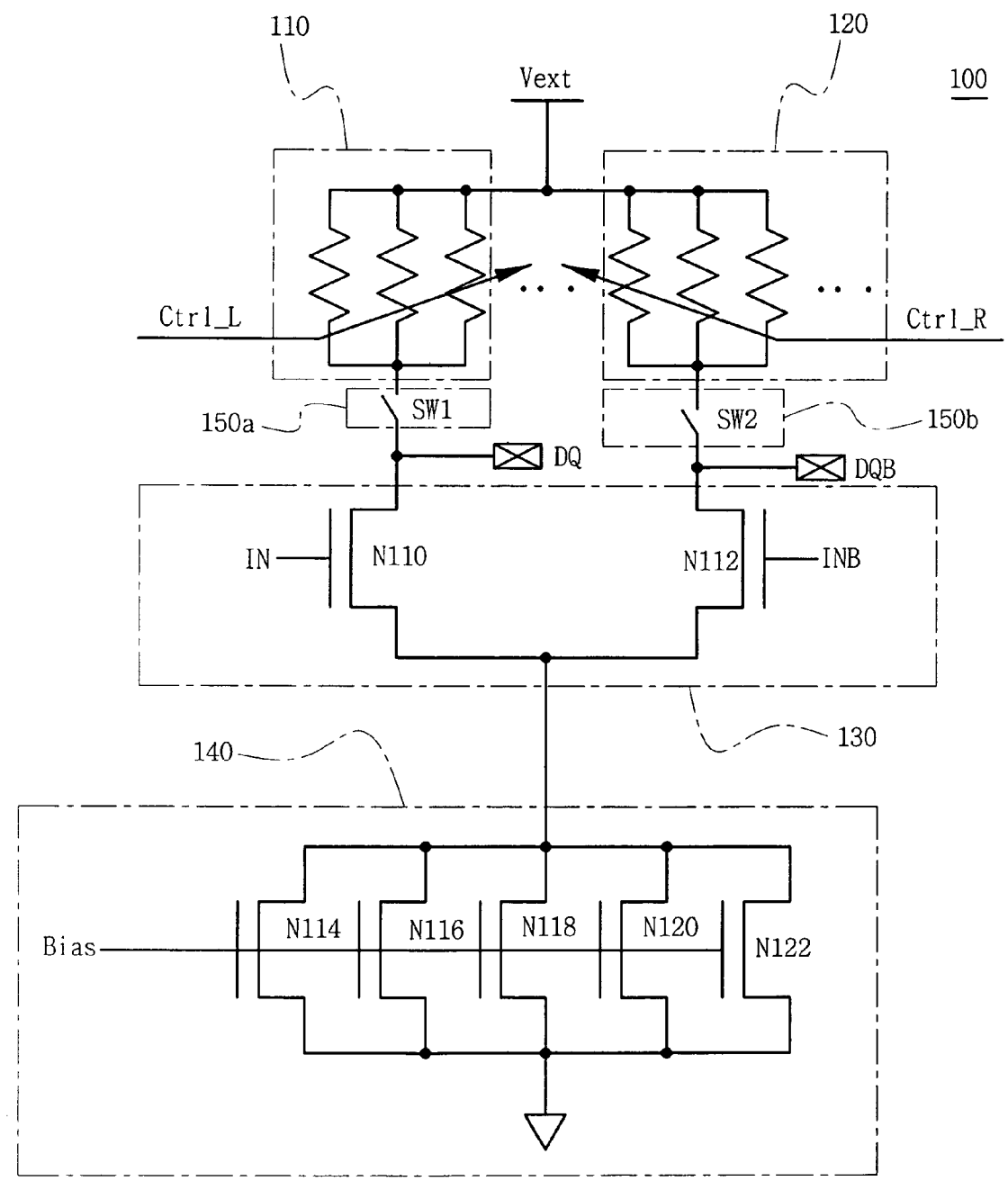
FIG. 4 is a circuit diagram of a semiconductor driver circuit, according to an embodiment of the present invention.

FIG. 4 shows a differential-ended mode output driver circuit 100 according to an embodiment of the present invention. The differential-ended mode output driver circuit 100 is formed as part of a semiconductor memory device in one embodiment of the present invention. However, the differential-ended mode output driver circuit 100 may also be incorporated in other types of semiconductor devices.

In FIG. 4, the output driver circuit 100 includes an external voltage terminal Vext, a first impedance unit 110, a second impedance unit 120, a clock input unit 130, and a biasing unit 140. The clock input unit 130 and the biasing unit 140 form a driving unit. The output driver circuit 100 also includes a first data pad DQ, a second data pad DQB, a first switching unit 150a, and a second switching unit 150b. The external voltage terminal Vext is formed as an external voltage pad having an external power supply voltage level VDDQ applied thereon in modes other than a test mode.

The first impedance unit 110 and the second impedance unit 120 provide termination resistances for the output driver circuit 100. The first and second impedance units 110 and 120 each provide a respective resistance that is independently controlled.

Figure 5:
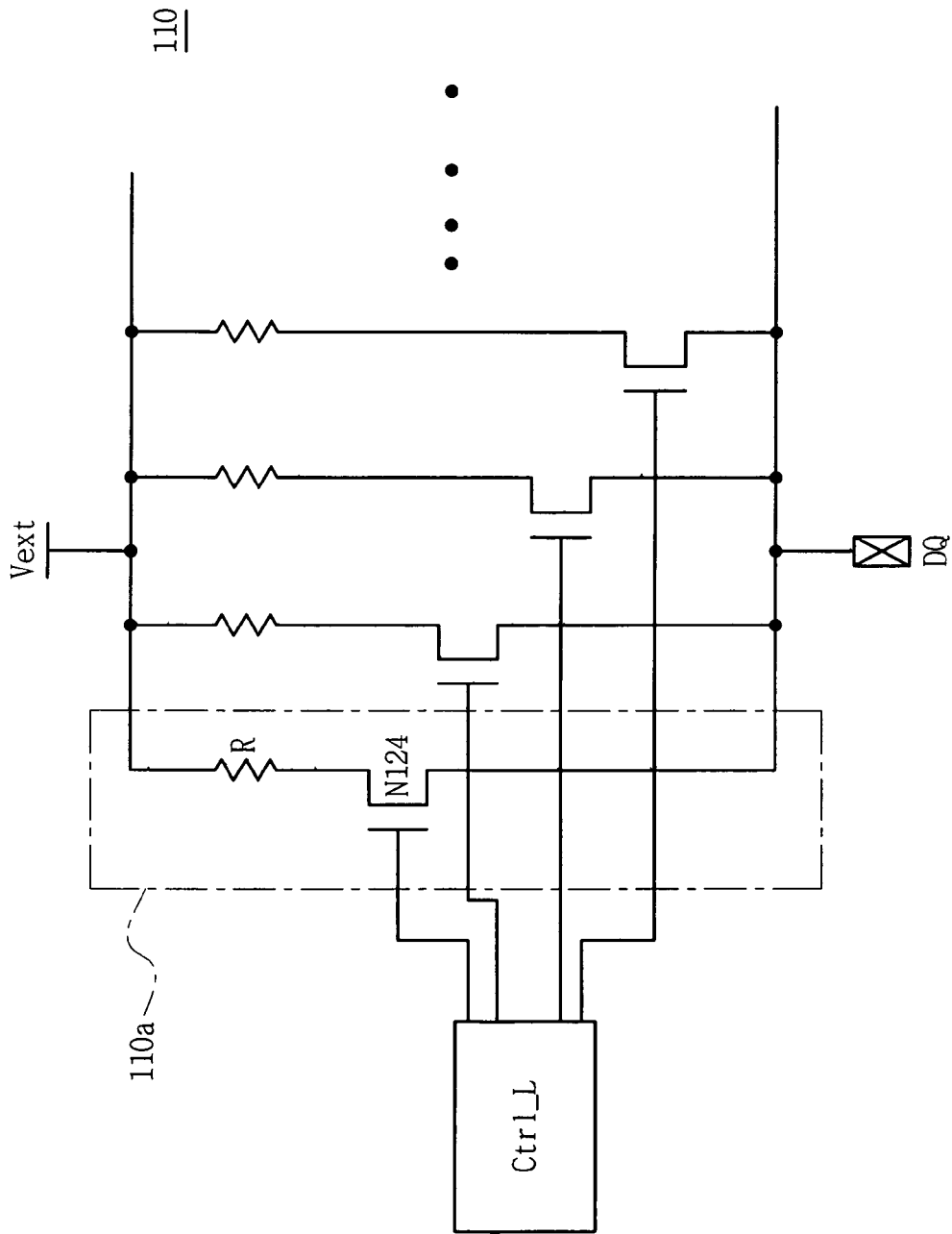
FIG. 5 is a detailed circuit diagram of a first impedance unit of FIG. 4, according to an embodiment of the present invention.

A detailed circuit diagram of such an example first impedance unit 110 is shown in FIG. 5. In FIG. 5, the first impedance unit 110 includes at least one unit resistance section 110a composed of a resistor R having a predetermined resistance and an NMOS transistor N124 coupled in series. A plurality of unit resistance sections 110a are connected in parallel with one another between the external voltage terminal Vext and the first data pad DQ. The number of the unit resistance sections 110a may be varied according to a desired sensitivity for controlling the impedance of the first impedance unit 110. In addition, the resistors R may be same or different among the unit resistance sections.

A first control code Ctrl_L for controlling the impedance of the first impedance unit 110 is comprised of binary bits with the number of binary bits being the same as the number of the unit resistance sections. For example, if the number of the unit resistance sections is four, the first control code Ctrl_L has four binary control bits. Each control bit is applied to a respective gate of the respective NMOS transistor of a respective unit resistance section to control connection between the respective resistor R and the first data pad DQ. The first control code Ctrl_L may be a mode register set code.

The second impedance unit 120 is implemented similarly as the first impedance unit 110 as illustrated in FIG. 5. Accordingly, a detailed description thereof is omitted. However, the second impedance unit 120 responds to a second control code Ctrl_R that is generated independently of the first control signal Ctrl_L. The second control code Ctrl_R controls which resistors R of the unit resistance sections is connected between the external voltage terminal Vext and the second data pad DQB. The second control code Ctrl_R may be a mode register set code that is independent from the first control code Ctrl_L.

The driving unit includes the clock input unit 130 and the biasing unit 140. The driving unit outputs complementary data signals to the first data pad DQ and the second data pad DQB in response to two complementary clock signals IN and INB.

The clock input unit 130 includes a first NMOS transistor N110 and a second NMOS transistor N112. The first NMOS transistor N110 is connected between the first data pad DQ and the biasing unit 140 for receiving the first clock signal IN at its gate. The second NMOS transistor N112 is connected between the second data pad DQB and the biasing unit 140 for receiving the second clock signal INB at its gate. The second clock signal INB is complementary to the first clock signal IN.

The biasing unit 140 acts as a current source and includes a plurality of NMOS transistors N114, N116, N118, N120 and N122 connected in parallel with one another between the clock input unit 30 and a ground terminal, in one embodiment of the present invention. The biasing unit 140 operates in response to an external bias signal Bias.

In the above-described output driver circuit, the first impedance unit 110, the second impedance unit 120, and the biasing unit 140 determine the swing widths of the data signals output at the first data pad DQ and the second data pad DQB. The impedances of the first impedance unit 110 and the second impedance unit 120 in FIG. 4 are independently controlled. Thus, the swing widths of a first data signal generated at the first data pad DQ and of a second data signal generated at the second data pad DQB are controlled independently of each-other. As a result, the swing widths of the first and second data signals may be controlled to be substantially equal for high speed operation of the driver circuit 100.

The first switching unit 150a and the second switching unit 150b operate during a test mode and are kept closed in other modes of operation. The first switching unit 150a controls coupling between the first impedance unit 110 and the first data pad DQ. That is, if the first switching unit 150a is opened, the first impedance unit 110 and the first data pad DQ are uncoupled (open state). If the first switching unit 150a is closed, the first impedance unit 110 and the first data pad DQ are coupled (short state).

The second switching unit 150b controls coupling between the second impedance unit 120 and the second data pad DQB. That is, if the second switching unit 150b is opened, the second impedance unit 120 and the second data pad DQB are uncoupled (open state). If the second switching unit 150b is closed, the second impedance unit 120 and the second data pad DQB are coupled (short state).

For open testing, both the first switching unit 150a and the second switching unit 150b are opened. For leakage and shorting, the respective switching unit for a selected data pad to be tested is opened and the other switching units are closed.

For such testing, the output driver circuit may further comprise a voltage control unit (not shown) capable of controlling a voltage level at the external voltage terminal/pad Vext such as by setting such a voltage level to a ground level (GND) or an external power supply voltage level (VDDQ) in a test mode and to the external power supply voltage level (VDDQ) in other operating modes.

The output driver circuit may also include a switching control unit (not shown) that controls the operation of the first switching unit 150a and the second switching unit 150b. The switching control unit independently controls the opening/closing of the first and second switching units 150a and 150b in a test mode, and closes the first and second switching units 150a and 150b in other operating modes. The voltage control unit and the switching control unit may be disposed inside or outside the chip.

Figure 8:
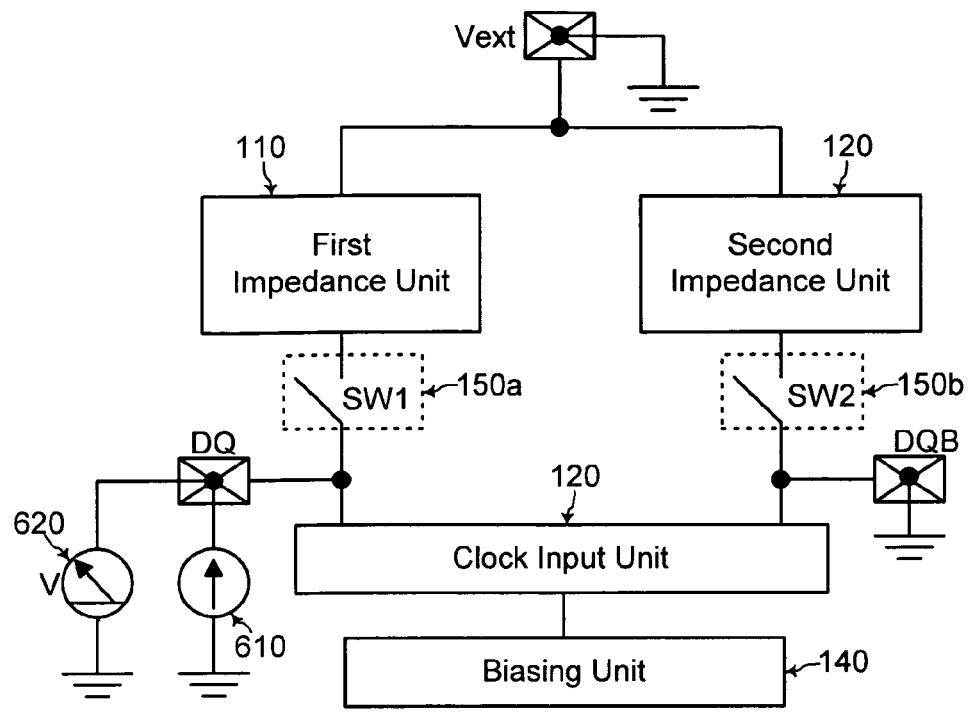
FIG. 8 is a block diagram of the semiconductor driver circuit of FIG. 4 configured for open testing, according to an embodiment of the present invention.

Open testing for the driver circuit 100 is now described in reference to FIG. 8. First, one of the two data pads DQ and DQB is selected for open testing. For convenience of understanding, assume that the first data pad DQ is selected. Next, the first switching unit 150a and the second switching unit 150b are all opened for uncoupling the impedance units 110 and 120 from the first and second data pads DQ and DQB. Data pads excluding the first data pad DQ (i.e., the second data pad DQB and the external voltage terminal Vext) are then grounded.

A predetermined level of current (e.g., +100 μA or −100 μA) from a current generator 610 is then applied to the first data pad DQ. A resulting voltage at the first data pad DQ is then measured with a volt meter 620. A determination is made as to whether the measured voltage is within an acceptable range (e.g., 0.1V to 2.0V or −2.0V to −0.1V) to detect faults.

If the measured voltage is within the acceptable range, connection of the first data pad DQ is deemed normal. If the measured voltage is not within the acceptable range, the connection of the first data pad DQ is deemed to be short-circuited or open-circuited. Thereafter, such a test is similarly performed on the second data pad DQB.

Figure 9:
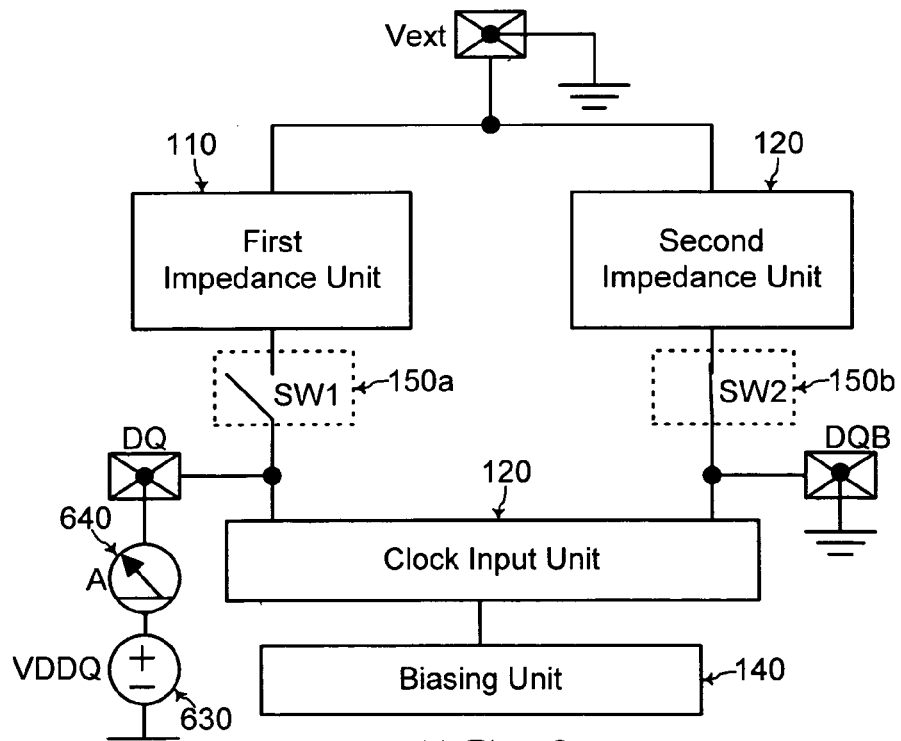
FIG. 9 is a block diagram of the semiconductor driver circuit of FIG. 4 configured for short and leakage testing, according to an embodiment of the present invention.
Figure 10:
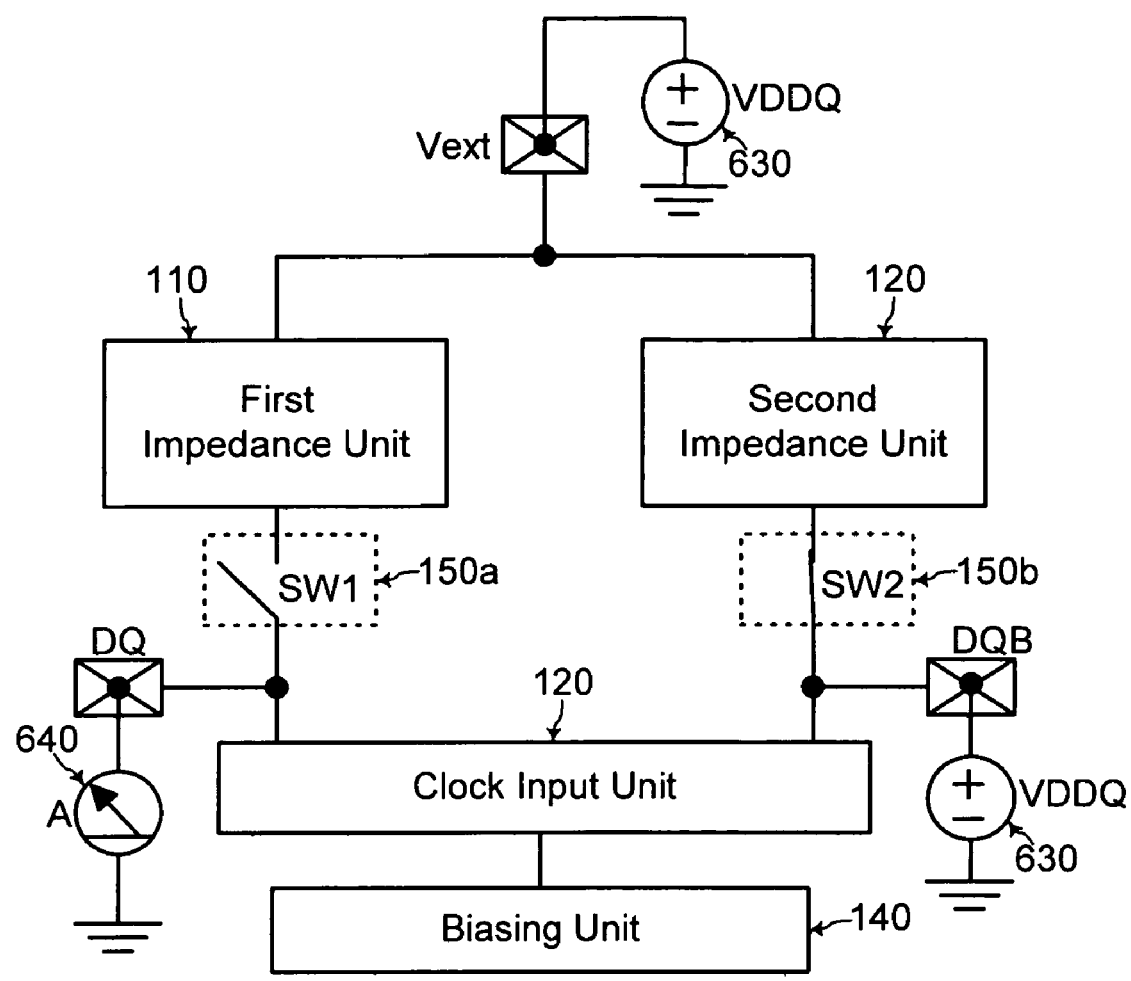
FIG. 10 is a block diagram of the semiconductor driver circuit of FIG. 4 configured for short and leakage testing, according to another embodiment of the present invention.

The leakage and short testing on the driver circuit 100 is now described with respect to FIGS. 9 and 10. First, one of the first data pad DQ and the second data pad DQB is selected for the leakage and short testing. For convenience of understanding, assume that the first data pad DQ is selected.

Next, only the selected first data pad DQ is uncoupled from the corresponding first impedance unit 110. That is, the first switching unit 150a is opened while the second switching unit 150b for any unselected data pad is kept closed. A first voltage level is then applied to the external voltage terminal Vext and to any unselected data pad DQB, and a second voltage level is applied to the selected first data pad DQ.

The first voltage level is an external power supply voltage level (VDDQ) from an external voltage source 630, and the second voltage level is a ground (GND), in one embodiment of the present invention (as illustrated in FIG. 10). Alternatively, the first voltage level is ground (GND), and the second voltage level is the external power supply voltage level (VDDQ) (as illustrated in FIG. 9).

Current flowing through the first selected data pad DQ is then measured with a current meter 640. A determination is made as to whether the measured current is within an acceptable range as suggested by a specification. Such determination is made for each of the configurations in FIGS. 9 and 10. If the respective measure current is within the acceptable range for each of the configurations in FIGS. 9 and 10, the connection for the first data pad DQ is determined to be normal and a next data pad will be tested.

In yet another embodiment of the present invention, the first control code Ctrl_L and the second control code Ctrl_R may be substituted for the first switching unit 150a and the second switching unit 150b.

Figure 6:
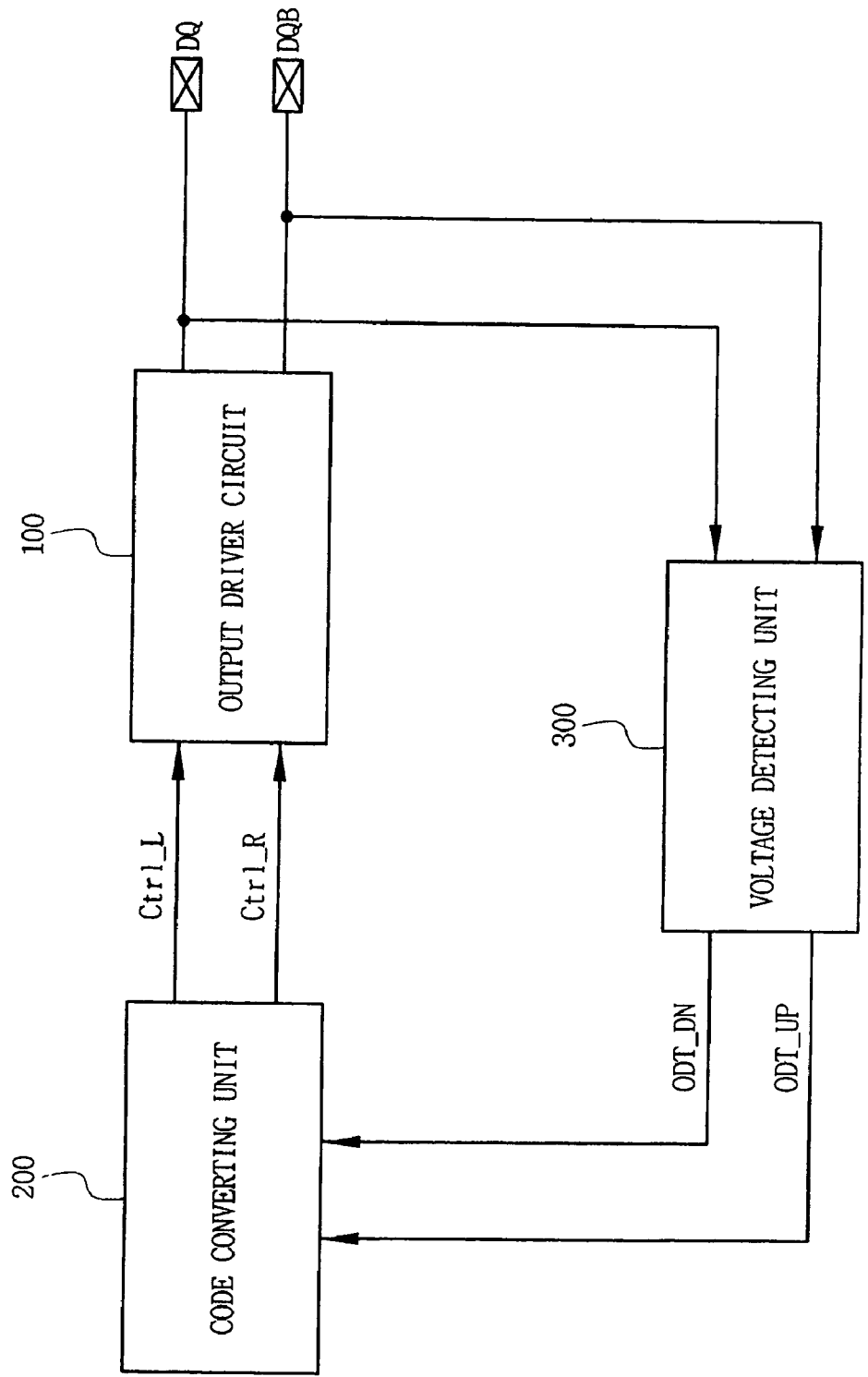
FIG. 6 is a block diagram of a semiconductor memory device including the semiconductor driver circuit of FIG. 4, according to another embodiment of the present invention.

FIG. 6 is a block diagram of a semiconductor device, such as a semiconductor memory device, according to another embodiment of the present invention. In FIG. 6, the semiconductor device includes the output driver circuit 100, a code converting unit 200, and a voltage detecting unit 300. FIG. 6 also shows the first data pad DQ and the second data pad DQB of the output driver circuit 100. The output driver circuit 100 is implemented similarly as in FIG. 4, in one embodiment of the present invention. However, the present invention may be practiced with other implementations for the output driver circuit providing impedance control.

The voltage detecting unit 300 compares the swing widths of the first and second data signals generated at the first and second data pads DQ and DQB to generate controls signals ODT_DN and ODT_UP to the code converting unit 200. For example, the control signals ODT_DN and ODT_UP indicate which of the first and second data signals has a smaller swing width.

In response to the control signals ODT_DN and ODT_UP, the code converting unit 200 adjusts the first and second control codes Ctrl_R and Ctrl_L such that the swing widths of the first and second data signals are substantially same. For example, the code converting unit 200 initially generates the first and second control codes Ctrl_L and Ctrl_R with predetermined values from independent mode register set codes. Upon subsequent receipt of the control signals ODT_DN and ODT_UP, the code converting unit 200 adjusts at least one of the control codes Ctrl_R and Ctrl_L to increase the swing width of the data signal having smaller swing width.

For example, assume that the first data signal has the smaller swing width as indicated by the control signal ODT_DN. In response to the control signal ODT_DN, the code converting unit 200 maintains the second control code Ctrl_R at an original value and changes the first control code Ctrl_L to increase the impedance of the first impedance unit (110 of FIG. 4) such that the swing width of the first data signal increases.

Figure 7:
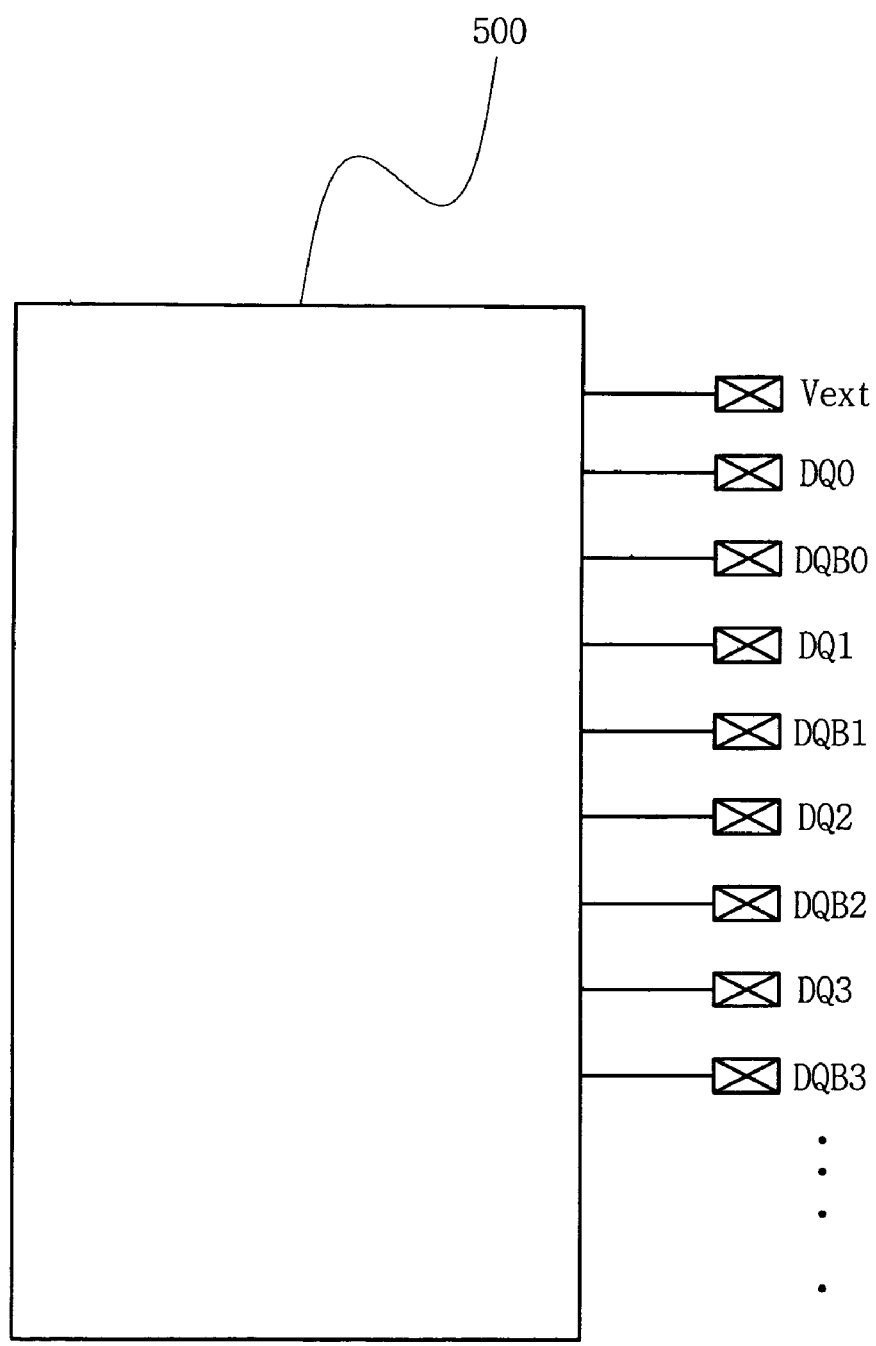
FIG. 7 is a block diagram of a semiconductor memory device, according to another embodiment of the present invention.

FIG. 7 is a block diagram of a semiconductor device, such as a semiconductor memory device, according to yet another embodiment of the present invention. In FIG. 7, the semiconductor device includes an external voltage pad Vext, and a plurality of data pads DQ0, DQB0, DQ1, DQB1, DQ2, DQB2, DQ3 and DQB3.

Each of the plurality of data pads DQ0, DQB0, DQ1, DQB1, DQ2, DQB2, DQ3 and DQB3 is independently connected to the external voltage pad Vext via a respective impedance unit (not shown). Examples of the data pads include the first data pad DQ connected to the external voltage pad Vext via the first impedance unit 110 and the second data pad DQB connected to the external voltage pad Vext via the second impedance unit 120, as shown in FIG. 4.

Each impedance unit may include one resistor having a predetermined resistance. Alternatively, each impedance unit may be configured by connecting a plurality of resistors in parallel with one another. Further, each impedance unit may have independently controlled impedance, as in FIG. 4.

Data signals are input/output to/from the plurality of data pads DQ0, DQB0, DQ1, DQB1, DQ2, DQB2, DQ3 and DQB3. The present invention may be practiced with a variable number of the data pads DQ0, DQB0, DQ1, DQB1, DQ2, DQB2, DQ3 and DQB3 depending on the semiconductor device 500.

Each of the plurality of pads DQ0, DQB0, DQ1, DQB1, DQ2, DQB2, DQ3 and DQB3 has a respective switching unit for independently controlling electrical connections to a respective impedance unit, for example the first and second switching units 150a and 150b, as shown in FIG. 4. The plurality of switching units are independently controlled in the test mode and the plurality of switching units are kept closed in other operating modes.

The semiconductor memory device 500 may further comprise a voltage control unit (not shown) for controlling a level of the external voltage that is applied to the external voltage pad Vext in the test mode, and a switching control unit (not shown) for controlling the operation of the plurality of switching units. The voltage control unit and the switching control unit may be disposed inside or outside the chip. The semiconductor device 500 may includes the output driver circuit of FIG. 4, in one embodiment of the present invention.

Open testing for the semiconductor device 500 is now described. First, one of the data pads DQ0, DQB0, DQ1, DQB1, DQ2, DQB2, DQ3 and DQB3 is selected to be tested. For convenience of understanding, assume that the first data pad DQ0 is selected. Next, the plurality of data pads DQ0, DQB0, DQ1, DQB1, DQ2, DQB2, DQ3 and DQB3 are all uncoupled from respective impedance units by opening the respective switching units.

All of the unselected data pads DQB0, DQ1, DQB1, DQ2, DQB2, DQ3 and DQB3 and the external voltage pad Vext are grounded. A predetermined current (e.g., +100 µA or −100 µA) is then applied to the selected first data pad DQ0. A voltage at the first data pad DQ0 is then measured. A determination is made as to whether the measured voltage is within an acceptable range (e.g., 0.1V to 2.0V or −2.0V to −0.1V) to detect faults.

If the measured voltage is within the acceptable range, the connection of the first pad DQ0 is deemed normal. If the measured voltage is not within the acceptable range, the connection of the first data pad DQ0 is deemed short-circuited or open-circuited. Thereafter, this test is performed on next data pads.

Leakage and short testing on the semiconductor device 500 is now described. First, one of the data pads DQ0, DQB0, DQ1, DQB1, DQ2, DQB2, DQ3 and DQB3 is selected to be tested. For convenience of understanding, assume that the first data pad DQ0 is selected.

Only the selected first data pad DQ0 is uncoupled to the respective impedance unit. Any unselected data pad (DQB0, DQ1, DQB1, DQ2, DQB2, DQ3 and DQB3) is coupled to the respective impedance unit. A first voltage level is then applied to the external voltage pad Vext and to any unselected data pad (DQB0, DQ1, DQB1, DQ2, DQB2, DQ3 and DQB3), and a second voltage level is applied to the selected first data pad DQ0.

The first voltage level is an external power supply voltage level (VDDQ), and the second voltage level is a ground level (GND). Current flowing through the selected first data pad DQ0 is measured. A determination is made as to whether there is a fault by comparing the measured current to a specification.

If a fault is not detected, the first voltage level is changed to the ground level (GND) and the second voltage level is changed to the external power supply voltage level (DDQ) to thereby re-measure the current flowing through the first data pad DQ0. Thereafter, a determination is made as to whether there is a fault by comparing the measured current to a specification. If any fault is still not detected, the connection for the first data pad DQ0 is deemed to be normal and a next data pad is tested.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any number of elements illustrated or described herein is by way of example only. In addition, while the present invention has been described for pads, the term "pad" should be broadly construed to include any pins or other types of nodes each having a signal generated thereon.

What is claimed is:

1. A semiconductor driver circuit comprising:
    a first impedance unit for generating a first impedance at a first data pad in response to a first control signal;
    a second impedance unit for generating a second impedance at a second data pad in response to a second control signal independent of the first control signal;
    wherein the first data pad outputs a first data signal, and wherein the second data pad outputs a second data signal that is complementary of the first data signal;
    wherein the first and second data signals have respective voltage swings; and means for adjusting the first and second control signals until the respective voltage swings of the first and second data signals are substantially equal.

2. The semiconductor driver circuit of claim 1, wherein the first data pad outputs a first data signal, and wherein the second data pad outputs a second data signal that is complementary to the first data signal.

3. The semiconductor driver circuit of claim 1, wherein the first impedance unit includes first transistors, each coupled in series with a respective first resistor, and wherein the first control signal determines which of the first transistors is turned on and which of the first respective resistors is coupled to the first data pad.

4. The semiconductor driver circuit of claim 3, wherein the second impedance unit includes second transistors, each coupled in series with a respective second resistor, and wherein the second control signal determines which of the second transistors is turned on and which of the second respective resistors is coupled to the second data pad.

5. The semiconductor driver circuit of claim 1, further comprising:
    a first switching unit coupled between the first impedance unit and the first data pad; and
    a second switching unit coupled between the second impedance unit and the second data pad,
    wherein at least one of the first and second switching unit uncouples at least one of the first and second impedance units from at least one of the first and second data pads during testing.

6. The semiconductor driver circuit of claim 1, wherein the semiconductor driver circuit is formed within a semiconductor memory device.

7. A semiconductor driver circuit comprising:
    a first impedance unit for generating a first impedance at a first data pad in response to a first control signal;
    a second impedance unit for generating a second impedance at a second data pad in response to a second control signal independent of the first control signal;
    a first switching unit coupled in series between the first impedance unit and the first data pad, wherein the first switching unit is used to couple or uncouple the first switching unit from the first data pad during testing of the semiconductor driver circuit; and
    a second switching unit coupled in series between the second impedance unit and the second data pad, wherein the second switching unit is used to couple or uncouple the second switching unit from the second data pad during the testing of the semiconductor driver circuit,
    wherein at least one of the first and second switching unit uncouples at least one of the first and second impedance units from at least one of the first and second data pads during the testing of the semiconductor driver circuit.

8. The semiconductor driver circuit of claim 7, wherein the semiconductor driver circuit is formed within a semiconductor memory device.

9. The semiconductor driver circuit of claim 7, wherein the first control signal affects the first impedance at the first data pad without affecting the second impedance at the second data pad, and wherein the second control signal affects the second impedance at the second data pad without affecting the first impedance at the first data pad.

10. The semiconductor driver circuit of claim 7, wherein the first data pad outputs a first data signal, and wherein the second data pad outputs a second data signal that is complementary to the first data signal.

11. The semiconductor driver circuit of claim 7, wherein the first impedance unit includes first transistors, each coupled in series with a respective first resistor, and wherein the first control signal determines which of the first transistors is turned on and which of the first respective resistors is coupled to the first data pad.

12. The semiconductor driver circuit of claim 11, wherein the second impedance unit includes second transistors, each coupled in series with a respective second resistor, and wherein the second control signal determines which of the second transistors is turned on and which of the second respective resistors is coupled to the second data pad.

13. A semiconductor device comprising:
    a driver circuit including:
        a first impedance unit for generating a first impedance at a first data pad in response to a first control signal; and
        a second impedance unit for generating a second impedance at a second data pad in response to a second control signal independent of the first control signal;
        wherein the first data pad outputs a first data signal, and wherein the second data pad outputs a second data signal;
    a voltage detecting unit that compare voltage swings of the first and second data signals to generate at least one comparison result signal; and
    a code converting unit, coupled to the voltage detecting unit, that adjusts the first and second control signals according to the at least one comparison result signal from the voltage detecting unit until the voltage swings of the first and second data signals are substantially equal.

14. The semiconductor device of claim 13, wherein the first impedance unit includes first transistors, each coupled in series with a respective first resistor, and wherein the first control signal determines which of the first transistors is turned on and which of the first respective resistors is coupled to the first data pad.

15. The semiconductor device of claim 14, wherein the second impedance unit includes second transistors, each coupled in series with a respective second resistor, and wherein the second control signal determines which of the second transistors is turned on and which of the second respective resistors is coupled to the second data pad.

16. The semiconductor device of claim 13, wherein the first and second data signals are complementary to each-other.

17. The semiconductor device of claim 13, wherein the semiconductor device is a semiconductor memory device.

* * * * *